(12) United States Patent
Yamaji et al.

(10) Patent No.: US 9,117,797 B2
(45) Date of Patent: Aug. 25, 2015

(54) HIGH-VOLTAGE SEMICONDUCTOR DEVICE

(71) Applicant: FUJI ELECTRIC CO., LTD., Kawasaki-shi (JP)

(72) Inventors: Masaharu Yamaji, Matsumoto (JP); Hitoshi Sumida, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/352,054

(22) PCT Filed: Nov. 13, 2012

(86) PCT No.: PCT/JP2012/079435
§ 371 (c)(1),
(2) Date: Apr. 15, 2014

(87) PCT Pub. No.: WO2013/073539
PCT Pub. Date: May 23, 2013

(65) Prior Publication Data
US 2014/0264583 A1    Sep. 18, 2014

(30) Foreign Application Priority Data

Nov. 14, 2011  (JP) ................. 2011-248375

(51) Int. Cl.
*H01L 29/40* (2006.01)
*H01L 27/088* (2006.01)
*H01L 21/8234* (2006.01)
*H01L 21/761* (2006.01)
*H01L 21/765* (2006.01)
*H01L 29/78* (2006.01)
*H01L 29/423* (2006.01)
*H01L 29/08* (2006.01)
*H01L 29/06* (2006.01)

(52) U.S. Cl.
CPC ............ *H01L 29/407* (2013.01); *H01L 21/761* (2013.01); *H01L 21/765* (2013.01); *H01L21/823481* (2013.01); *H01L 27/088* (2013.01); *H01L 29/402* (2013.01); *H01L 29/7811* (2013.01); *H01L 29/7816* (2013.01); *H01L 29/063* (2013.01); *H01L 29/0878* (2013.01); *H01L 29/42368* (2013.01)

(58) Field of Classification Search
CPC ................ H01L 29/407; H01L 27/088; H01L 21/823481; H01L 21/761; H01L 21/765; H01L 29/402; H01L 29/7816; H01L 29/7811
See application file for complete search history.

(56) References Cited

U.S. PATENT DOCUMENTS

| | | |
|---|---|---|
| 5,894,156 A | 4/1999 | Terashima et al. |
| 6,809,393 B1 | 10/2004 | Yamazaki |
| 2010/0283116 A1 | 11/2010 | Shimizu |

FOREIGN PATENT DOCUMENTS

| | | |
|---|---|---|
| JP | 09-283716 A | 10/1997 |
| JP | H11-243152 A | 9/1999 |
| JP | 2000-286391 A | 10/2000 |
| JP | 2002-076124 A | 3/2002 |
| JP | 3941206 B2 | 7/2007 |

OTHER PUBLICATIONS

Terashima, T. et al., "A New Level-Shifting Technique by Divided Resurf Structure", 1997 IEEE International Symposium on Power Semiconductor Devices and IC's, ISPSD '97, May 26-29, 1997, pp. 57-60.

S. L. Kim et al., "Realization of robust 600V high side gate drive IC with a new isolated self-shielding structure", Proceedings of the 17 International Symposium on Power Semiconductor Devices & IC's, May 23-26, 2005, pp. 143-146.

Jizhi Liu., "A Quasi-3D Simulation for High-Voltage Level-Shifting Circuit by Divided RESURF Structure", 2009 IEEE International Conference on Applied Superconductivity and Electromagnetic Devices, Chengdu, China, Sep. 25-27, 2009.

European Search Report dated Jun. 9, 2015.

*Primary Examiner* — Long Pham
(74) *Attorney, Agent, or Firm* — Rabin & Berdo, P.C.

(57) ABSTRACT

A withstand voltage region is formed to surround a logic circuit formation region. A high-voltage MOSFET for level shifting is formed in part of the withstand voltage region. A p⁻ opening region is formed between a drain region of the high-voltage MOSFET and the logic circuit formation region. A shield layer connected to the negative electrode side of a power supply connected to the logic circuit formation region is disposed on the p⁻ opening region. Thus, it is possible to provide a high-voltage semiconductor device including a level shifting circuit capable of making stable operation during the switching of a high-voltage IC and with long-term reliability.

8 Claims, 11 Drawing Sheets

HIGH-VOLTAGE SEMICONDUCTOR DEVICE

TECHNICAL FIELD

The present invention relates to a high-voltage semiconductor device. Particularly, it relates to a high-voltage semiconductor device including a level shifting circuit capable of transmitting an on/off signal from a circuit placed at ground potential to a gate of a power device, which constitutes an upper arm of a power-inverting bridge circuit such as a PWM inverter or a switching power supply, without potential isolation.

BACKGROUND ART

Power devices such as IGBTs or power MOSFETs have been used in many fields including power supply applications for PDPs (Plasma Display Panels), liquid crystal panels, etc., inverters for home appliances such as air conditioners or illuminations, etc. as well as inverters for controlling motors. In the background art, an electronic circuit configured by combination of semiconductor devices such as photo-couplers and electronic parts such as transformers is used for driving and controlling such a power device.

In recent years, with the development of LSI (Large-Scale Integrated circuit) technology, high-voltage semiconductor devices (high-voltage ICs) of up to 1200V class for use in industrial power supplies of 400V AC type or the like have been put to practical use. For example, a gate driver IC including a high-side gate driver and a low-side gate driver of a power device, a one-chip inverter IC in which a control circuit or a power device is further integrated on one and the same semiconductor substrate, etc. have been grouped as high-voltage ICs. These high-voltage ICs can reduce the number of parts on a mounting board, and contribute to miniaturization and higher efficiency of an inverter system as a whole due to the reduction in the number of parts on the mounting board.

FIG. 7 is a circuit diagram of a high-voltage IC including a typical level shifting circuit. In FIG. 7, IGBTs (output power devices) 17 and 18 constitute, for example, one phase of a power-inverting bridge circuit of a PWM (Pulse Width Modulation) inverter. This power-inverting bridge circuit is, for example, connected in series between a high-voltage principal DC power supply (positive electrode side) Vdc of 400V DC and a common potential COM which is the negative electrode side of the power supply.

An OUT terminal is a connection point between the emitter of the IGBT 17 in an upper arm of the bridge circuit and the collector of the IGBT 18 in a lower arm of the same bridge circuit. This OUT terminal is an AC output terminal of AC power generated by the IGBTs 17 and 18 turned on/off in a complementary manner.

An auxiliary DC power supply (also referred to as driver power supply) E1 has a positive electrode connected to a positive electrode line Vcc1 and a negative electrode connected to the AC output terminal OUT. A boot strap capacitor in a boot strap circuit has been often used as the auxiliary DC power supply (also referred to as driver power supply) E1.

An auxiliary DC power supply (also referred to as driver power supply) E2 has a positive electrode connected to a positive electrode line Vcc2 and a negative electrode connected to the common potential COM. Each of the auxiliary DC power supplies E1 and E2 is, for example, a low voltage power supply of 15 V. A driver circuit 20 is a circuit for on/off driving the IGBT 18 in the lower arm. The driver circuit 20 operates under the auxiliary DC power supply E2.

A level shifting circuit and a driver circuit 16 for driving the IGBT 17 in the upper arm of the bridge circuit are provided in the other circuit portion in the high-voltage IC. In addition, a control circuit 61 for inputting on/off signals to the driver circuits 16 and 20 respectively, etc. are also provided in the other circuit portion in the high-voltage IC.

A MOSFET 1 is a high-voltage N-channel MOSFET. On receiving an ON signal 25 of a set pulse generated by the control circuit (low-potential side low-voltage circuit) 61, the MOSFET 1 has electric continuity. A current is supplied to the control circuit 61 by a low voltage power supply with reference to the negative electrode side (COM potential) of a principal DC power supply. The high-voltage IC turns on the IGBT 17 in response to a signal derived from voltage drop in a load resistance 3 caused by the electric continuity.

In addition, a MOSFET 2 is a high-voltage N-channel MOSFET like the aforementioned MOSFET 1. On receiving a reset pulse signal 26 generated by the control circuit 61, the MOSFET 2 has electric continuity. The high-voltage IC turns off the IGBT 17 in response to a signal derived from voltage drop in a load resistance 4 caused by the electric continuity.

The high-voltage N-channel MOSFETs 1 and 2 and the load resistances 3 and 4 are normally configured to be equal to each other in order to fit their circuit constants to each other, respectively. Constant voltage diodes 5 and 6 are connected in parallel with the load resistances 3 and 4 respectively. The constant voltage diodes 5 and 6 play roles of limiting excessive voltage drops in the load resistances 3 and 4 so as to protect NOT circuits 8 and 9 and so on, which will be described below.

Of the level shifting circuit, the two high-voltage N-channel MOSFETs 1 and 2 serve as circuit portions which receive signals referring to the common potential COM. The circuit portion surrounded by the broken line in FIG. 7 is a high-potential-side low-voltage circuit portion (floating potential region) whose potential fluctuates. This circuit portion operates with reference to the potential of the AC output terminal OUT which follows the common potential COM and the potential Vdc of the high-voltage principal DC power supply alternately in accordance with the output IGBTs 17 and 18 turned on/off.

The NOT circuits 8 and 9 and a subsequent-stage circuit (constituted by low pass filter circuits (also abbreviated to LPFs) 30 and 31, an RS flip-flop (also referred to as RS latch or RS-FF) 15, the driver 16, etc.) operate using the auxiliary DC power supply E1 as a power source.

The potential in the AC output terminal OUT varies between the common potential COM and the principal DC power supply (positive electrode side) Vdc. Therefore, the power supply voltage of the load resistance circuit for each high-voltage N-channel MOSFET 1, 2 varies between E1+Vdc and E1. An upper end of the load resistance 3, 4 for the high-voltage N-channel MOSFET 1, 2 is connected to the positive electrode line Vcc1 of the auxiliary DC power supply E1.

Next, the operation of the level shifting circuit will be described. When a current flows into the high-voltage N-channel MOSFET 1 in response to the ON signal 25 applied to the gate of the high-voltage N-channel MOSFET 1, a voltage drop occurs in the load resistance 3. When the potential in a lower end of the load resistance 3 drops to a threshold value of the NOT circuit 8 or lower, the output of the NOT circuit 8 becomes Hi. This Hi level is applied to a set terminal S of the RS latch 15 through the LPF 30. Thus, an output Q of the RS latch 15 becomes Hi, so as to turn on the IGBT 17 through the driver 16. The IGBT 18 is turned off through a not-shown circuit including the driver 20 in response to a signal from the control circuit 61 at the same time that the IGBT 17 is turned on (strictly at a time point slightly before this on time point, in order to prevent short-circuit between the arms).

Next, when a current flows into the high-voltage N-channel MOSFET 2 in response to the OFF signal 26 applied to the gate of the high-voltage N-channel MOSFET 2, a voltage drop occurs in the load resistance 4. When the potential in a lower end of the load resistance 4 drops to the threshold value of the NOT circuit 9 or lower, the output of the NOT circuit 9 becomes Hi. This Hi level is applied to a reset terminal R21 of the RS latch 15 through the LPF 31. Thus, the output Q of the RS latch 15 becomes Lo, so as to turn off the IGBT 17 through the driver 16. The IGBT 18 is turned on through the driver 20 in response to a signal from the control circuit 61 at the same time that the IGBT 17 is turned off (strictly at a time point slightly after this off time point, in order to prevent short-circuit between the arms).

In the background art, there is a divided RESURF technique (for example, see the following NPL 1 or NPL 2) in which a high-voltage N-channel MOSFET as a level shifting device serving as an interface between a high-voltage-side reference circuit and a low-voltage-side reference circuit in a high-voltage IC is integrated with a high-voltage junction termination region as a withstand voltage region of a high-side drive circuit. According to this technique, high-potential wiring can be eliminated from the drain of the high-voltage N-channel MOSFET crossing over a ground potential region, so as to make a great contribution to a guarantee of high withstand voltage up to 1,200V class as a high-voltage IC and reduction in chip size.

PTL 1 (identified further on) has given description about a high-voltage IC using a divided RESURF technique in which a high-voltage N-channel MOSFET and a high-voltage junction termination region are integrated. PTL 1 has given description about a method in which high-potential wiring by which a potential difference (voltage) ranging from ground potential up to 1,200V may be applied to an insulating substrate formed on a semiconductor substrate is eliminated from wiring connection between a high-voltage N-channel MOSFET for level shifting and an isolation island region (high-side logic circuit region).

According to this method, the substrate is exposed between the high-voltage N-channel MOSFET and the isolation island region so as to provide a narrow p⁻ type slit region (p⁻ opening region) which reaches a ground potential region in the depth direction. With provision of the p⁻ type slit region, the structure is formed so that an n type diffusion layer is perfectly isolated by the p⁻ type slit region.

In the technique described in PTL 1, a depletion layer spread from the high-voltage N-channel MOSFET is connected with a depletion layer spread from the isolation island region when high potential (about 1,200 V) is applied to wiring connecting between the high-voltage N-channel MOSFET and the isolation island region. Thus, the potential in the region where the substrate under the interconnect wiring is exposed is increased to intermediate potential, so as to prevent the insulating film from insulation breakdown.

Here, in order to relax an electric field near the p⁻ type slit region, a polysilicon field plate whose potential is as high as the potential of the drain layer of the high-voltage N-channel MOSFET is provided on the p⁻ type slit region through an insulating film. Thus, punch-through between the n diffusion region of the drain of the high-voltage N-channel MOSFET and the n diffusion region of the RESURF isolation island as a high-side circuit formation region can be prevented by the field plate effect using the polysilicon layer.

In the aforementioned divided RESURF technique, the p⁻ type slit region perfectly divides the drain of the high-voltage N-channel MOSFET and the n diffusion region of the RESURF isolation island as the high-side circuit formation region. When the p⁻ type slit region near the ground potential is covered with the polysilicon field plate fixed to the drain potential of the high-voltage N-channel MOSFET in such a configuration, the extension of the depletion layer is limited to lower the voltage withstanding characteristic largely. It is therefore impossible to cover all over the p⁻ type slit region with the fixed-potential field plate in the aforementioned divided RESURF technique.

In addition, in the technique described in PTL 1, the polysilicon field plate whose potential is as high as the drain layer of the high-voltage N-channel MOSFET near the p⁻ type slit region is provided on the p⁻ type slit region through an insulating film. In this manner, there is an effect to prevent punch-through between the n diffusion region of the drain of the high-voltage N-channel MOSFET and the n diffusion region of the RESURF isolation island as the high-side circuit formation region.

In the technique described in PTL 1, the potential of the polysilicon field plate is fixed to be as high as the potential of the drain. Therefore, for example, at the timing when the high-voltage N-channel MOSFET 1 is off and the high-voltage N-channel MOSFET 2 is on, the potential in the drain node of the high-voltage N-channel MOSFET 1 becomes as high as the high-side highest potential Vcc 1 (about 15 V here).

PTL 2 (identified further on) has given description that a p⁻ type opening region reaching a p substrate is formed between a drain region of each high-voltage N-channel MOSFET 1, 2 and an n type diffusion region where a high-side drive circuit is formed. Thus, a parasitic resistance component existing between the high-voltage N-channel MOSFET 1, 2 and the n type diffusion region where a high-side drive circuit is formed is increased.

FIGS. 8 and 9 show a high-voltage semiconductor device shown in PTL 2. FIG. 8 is a main part plan view, and FIG. 9 is a main part sectional view of the high-voltage semiconductor device taken on line C-C' in FIG. 8. As shown in FIGS. 8 and 9, PTL 2 has given description that an opening region 221 in which a semiconductor substrate (p⁻ substrate 200) is exposed locally is provided between left n drain region and right n region where a high-voltage MOSFET for level shifting is formed, so as to increase a parasitic resistance R1 between an n drain region 205 of the high-voltage MOSFET and an isolation island region (right n⁻ well region 201b), while the parasitic resistance R1 is set at a larger resistance value than a load resistance element (for example, polysilicon resistance $R_{L1}$ or the like) connected to the n drain region 205 and the isolation island region (right n⁻ well region 201b), and the load resistance element is used as a level shifting resistance so that a stable level shifting circuit can be achieved.

In FIG. 8, only one high-voltage MOSFET is depicted. In such a one-input system, the high-voltage MOSFET is turned on for a long time, and a through-current continues to flow when the high-voltage MOSFET is on. Thus, the power consumption increases. In order to avoid this, a two-input system in which two high-voltage MOSFETs are provided in each high-voltage semiconductor device is used, and an ON signal and an OFF signal are transmitted as pulses. Thus, the ON period of each high-voltage MOSFET is shortened so that the power consumption in the level shifter can be reduced on a large scale. The two-input system is ordinarily and often used in high-voltage semiconductor devices. Though an HVIC corresponding to the one-input system has been described in PTL 2 for the sake of simplification, PTL 2 has given description that a similar effect can be obtained in the same manner, also in the two-input system.

In FIGS. 8 and 9, the reference sign 200 represents a p⁻ substrate; 201*a* and 201*b*, n⁻ well regions; 202, a p⁻ offset region; 203, an n region; 204, a p well region; 205, an n drain region; 206, a p⁺ region; 210, an n⁺ source region; 211, a first n⁺ source region; 212, a second n⁺ source region; 213, an n⁺ region; 214, an n⁺ region; 215, a p⁺ region; 216, a p⁺ region; 221, an opening region; 231, a gate electrode; 241, a COM electrode; 242, a drain electrode wiring; 243, a high-potential electrode; 244, a low-potential electrode; and 251, a high-resistance region.

CITATION LIST

Patent Literature

PTL 1: Japanese Patent No. 3917211
PTL 2: Japanese Patent No. 3941206

Non-Patent Literature

NPL 1: "A New Level-shifting Technique by divided RESURF Structure", T. Terashima and other two, 1997, IEEE International Symposium on Power Semiconductor Devices & ICs), May 26-29, 1997, Weimar, Germany, p. 57-60
NPL 2: "Realization of Robust 600V High Side Gate Drive IC with a New Isolated Self-Shielding Structure", S. L. Kim and other three, Proceedings of the 17 International Symposium on Power Semiconductor or Devices & ICs, May 23-26, 2005, Santa Barbara, Calif., p. 143-146

Technical Problem

However, in the aforementioned technique in PTL 1, the potential in the polysilicon field plate on the high-voltage N-channel MOSFET 1 side is fixed to be as high as the potential in the drain, that is, to be the potential Vcc1. Therefore, an N type inversion phenomenon occurs in the surface of the p⁻ type slit region, so that it is likely that a leak path of an N type inversion layer is generated in the surface of the p⁻ type slit region surrounding the drain region of the high-voltage N-channel MOSFET 1 on the set signal side as shown in FIG. 11.

FIG. 10 is a view for explaining the influence of the p⁻ opening in FIG. 8 on the voltage withstanding characteristic. FIG. 10 shows the situation in which the N type inversion layer of the high-voltage N-channel MOSFET 1 is formed. FIG. 11 is a chart showing the signal waveform in each portion of the high-voltage semiconductor device. FIG. 11 is a view showing a timing chart between a signal of each terminal and a drain potential. FIG. 11 shows the potential state at a timing of a period A immediately before a voltage drop begins to appear in the ON current due to the load resistance 3 after the high-voltage N-channel MOSFET 1 on the set signal side is turned on, of the timing chart showing the drain potential of the high-voltage N-channel MOSFET 1 in response to a set/reset signal.

As shown in FIGS. 10 and 11, when the N type inversion layer is formed, a resistance component generated by a leak path appears in parallel with and separately from the load resistance 3 connected to the drain node of the high-voltage N-channel MOSFET 1. Thus, it can be considered that, when the drain and the n diffusion region of the Vcc1 potential are connected in a low resistance state (short-circuit state), a sufficient voltage drop cannot be obtained by the load resistance 3 (level shifting resistance), causing a failure that the set signal cannot be accepted.

In addition, in the aforementioned technique in PTL 2, there is no description about the surface shield of the p⁻ type opening region in use as a level shifting circuit. In addition, in the aforementioned technique in PTL 2, description of a method for forming drain wiring of the high-voltage N-channel MOSFET 1, 2 is simplified as shown in the background-art example in FIGS. 8 and 9, and there is no special description about the method.

In the aforementioned level shifting circuit of FIG. 7, it is desired that the level shifting circuit is operated stably with respect to the fluctuation of the potential in the drain node during the switching of the high-voltage N-channel MOSFETs 1 and 2.

SUMMARY

In order to solve the aforementioned problems inherent in the background art, an object of the invention is to provide a high-voltage semiconductor device including a level shifting circuit capable of making stable operation during the switching of a high-voltage IC and with long-term reliability.

In order to solve the foregoing problems and attain the object, a high-voltage semiconductor device according to the invention includes: a second conductivity type well region which is formed on a first conductivity type semiconductor substrate and includes a logic circuit formation region and a withstand voltage region surrounding the logic circuit formation region; a first conductivity type well region which is formed on the semiconductor substrate so as to surround the withstand voltage region; a transistor which includes a second conductivity type drain region selectively formed in a surface layer of the second conductivity type well region between the withstand voltage region and the logic circuit formation region and having a higher concentration of impurities than the withstand voltage region, and a second conductivity type source region selectively formed in the surface layer of the second conductivity type well region, and which uses the withstand voltage region between the drain region and the source region as a drift region and uses the first conductivity type well region as a base region; an opening region which is provided locally in the second conductivity type well region between the drain region and the logic circuit formation region so as to prevent the second conductivity type well region from lying all over the opening region in a depth direction; and a conductive path which electrically connects the drain region with a logic circuit in the logic circuit formation region. The high-voltage semiconductor device is characterized by further including: a shield layer which is formed on a first insulating layer formed on a surface of the opening region and which is connected to a negative electrode side of a power supply connected to the logic circuit in the logic circuit formation region.

In addition, a high-voltage semiconductor device according to the invention includes: a second conductivity type well region which is formed on a first conductivity type semiconductor substrate and includes a logic circuit formation region and a withstand voltage region surrounding the logic circuit formation region; a first conductivity type well region which is formed on the semiconductor substrate so as to surround the withstand voltage region; a transistor which includes a second conductivity type drain region selectively formed in a surface layer of the second conductivity type well region between the withstand voltage region and the logic circuit formation region and having a higher concentration of impurities than the withstand voltage region, and a second conductivity type source region selectively formed in the surface layer of the second conductivity type well region, and which uses the withstand voltage region between the drain region and the source region as a drift region and uses the first conductivity type well region as a base region; an opening region which is provided locally in the second conductivity type well region between the drain region and the logic circuit formation region so as to prevent the second conductivity type well region from lying all over the opening region in a depth direction; and a conductive path which electrically connects the drain region with a logic circuit in the logic circuit formation region; the high-voltage semiconductor device being characterized in that: the conductive path does not cross over the opening region.

The high-voltage semiconductor device according to the invention may also be configured such that, in the invention described above, the conductive path is formed on the shield layer through a second insulating layer so as to cross over the opening region.

The high-voltage semiconductor device according to the invention may also be configured such that, in the invention described above, the conductive path and the shield layer are conductive layers which are formed on the same insulating layer.

The high-voltage semiconductor device according to the invention may also be configured such that, in the invention described above, the high-voltage semiconductor device further includes a second conductivity type pickup region which is provided in the surface layer of the second conductivity type well region between the withstand voltage region and the opening region so as to be connected to a high potential side of the power supply in the logic circuit formation region formed separately from the drain region, and the shield layer is formed on a surface between the drain region and the second conductivity type pickup region through the first insulating layer.

The high-voltage semiconductor device according to the invention may also be configured such that, in the invention described above, the high-voltage semiconductor device further includes a second conductivity type buffer region which is formed between the drain region and the second conductivity type pickup region so as to abut against these two regions, and which has a higher concentration of impurities than the second conductivity type well region and a lower concentration of impurities than the drain region and the second conductivity type pickup region.

The high-voltage semiconductor device according to the invention may also be configured such that, in the invention described above, opposite ends of the opening region reach the first conductivity type well region so that the second conductivity type well region in which the drain region is formed is separated from the logic circuit formation region.

Advantageous Effects of Invention

According to a high-voltage semiconductor device according to the invention, there is an effect that it is possible to provide a high-voltage semiconductor device including a level shifting circuit capable of making stable operation during the switching of a high-voltage IC and with long-term reliability.

DETAILED DESCRIPTION

Preferable embodiments of high-voltage semiconductor devices according to the invention will be described below in detail with reference to the accompanying drawings.

The invention relates to a high-voltage semiconductor device. Particularly the invention relates to a high-voltage semiconductor device including a level shifting circuit capable of transmitting an on/off signal from a circuit placed at ground potential to a gate of a power device, which constitutes an upper arm of a power-inverting bridge circuit such as a PWM inverter or a switching power supply, without potential isolation.

The drawings are schematically illustrative and different from real ones as to the relation between thicknesses and planar dimensions, the ratio in thickness among layers, etc. Therefore, specific thicknesses and dimensions should be determined in consideration of the following description. In addition, the drawings include portions that are different among the drawings as to the mutual relation or ratio in dimensions.

Example 1

Figure 1:
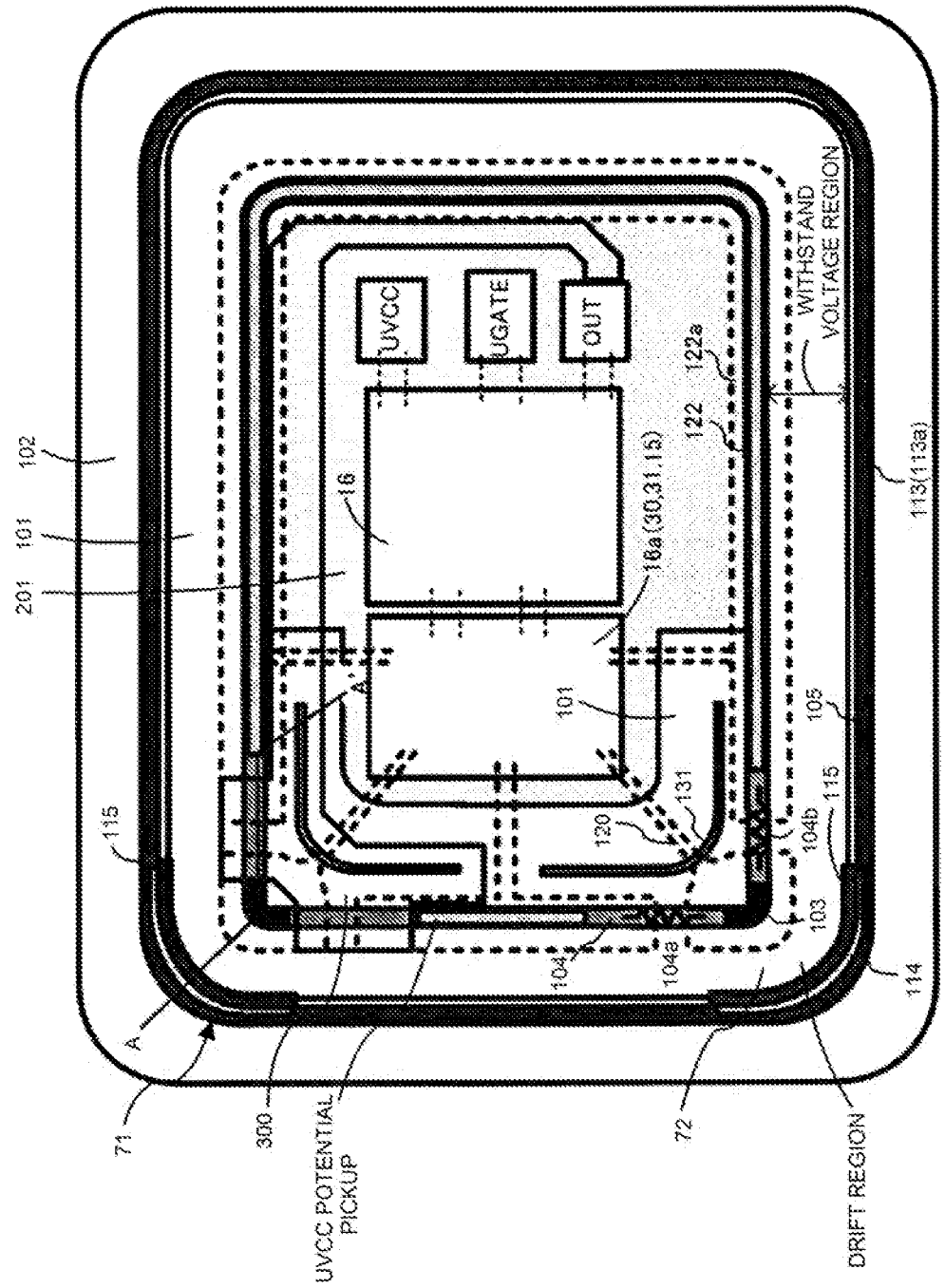
FIG. 1 is a main part plan view of a high-voltage semiconductor device according to Example 1 of the invention.
Figure 2:
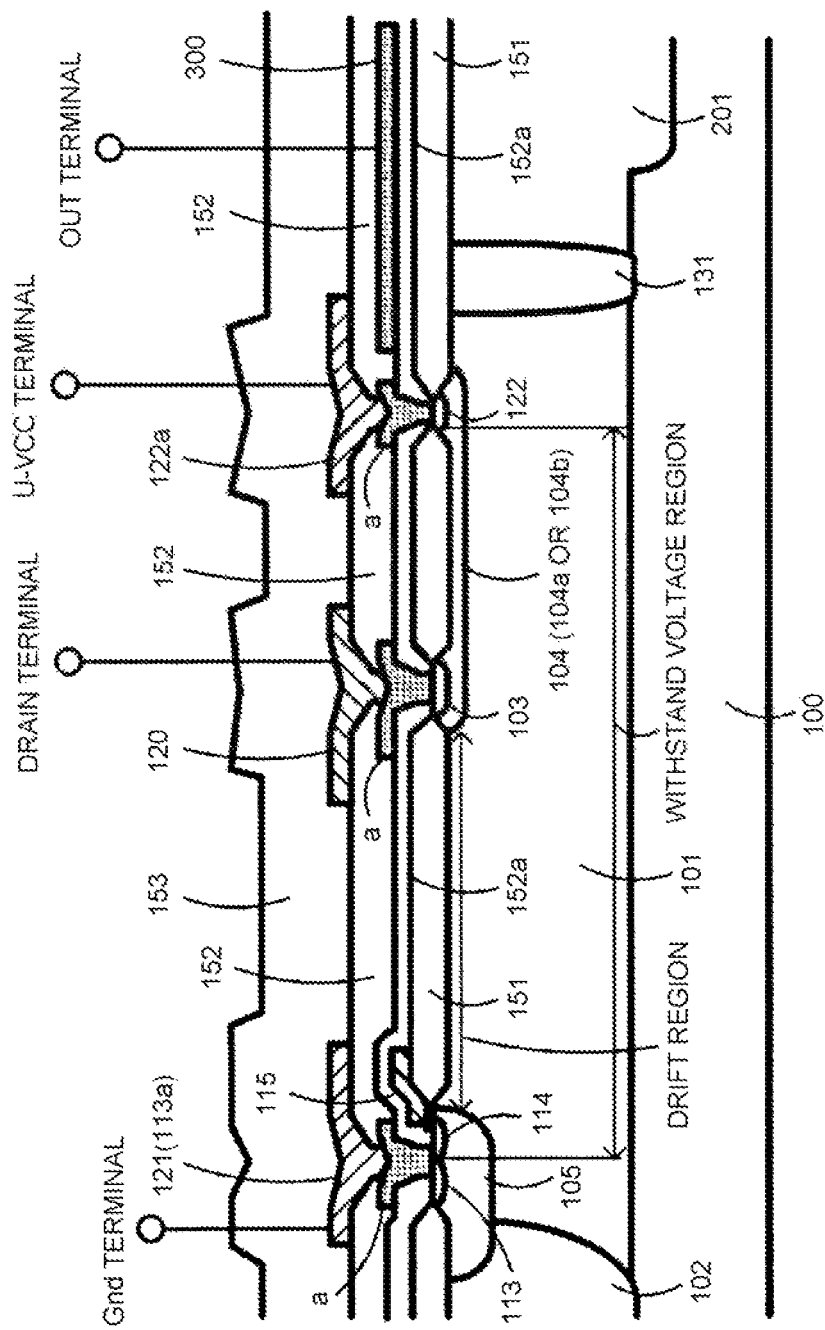
FIG. 2 is a main part sectional view of the high-voltage semiconductor device according to Example 1 of the invention taken on line A-A' in FIG. 1.

FIG. 1 is a main part plan view of a high-voltage semiconductor device according to Example 1 of the invention. FIG. 1 shows a plane of a main part of a high-voltage IC in which a level shifting circuit portion including high-voltage N-channel MOSFETs and a drive circuit including a floating potential region are formed in one and the same semiconductor substrate. FIG. 2 is a main part sectional view of the high-voltage semiconductor device according to Example 1 of the invention taken on line A-A' in FIG. 1.

Figure 7:
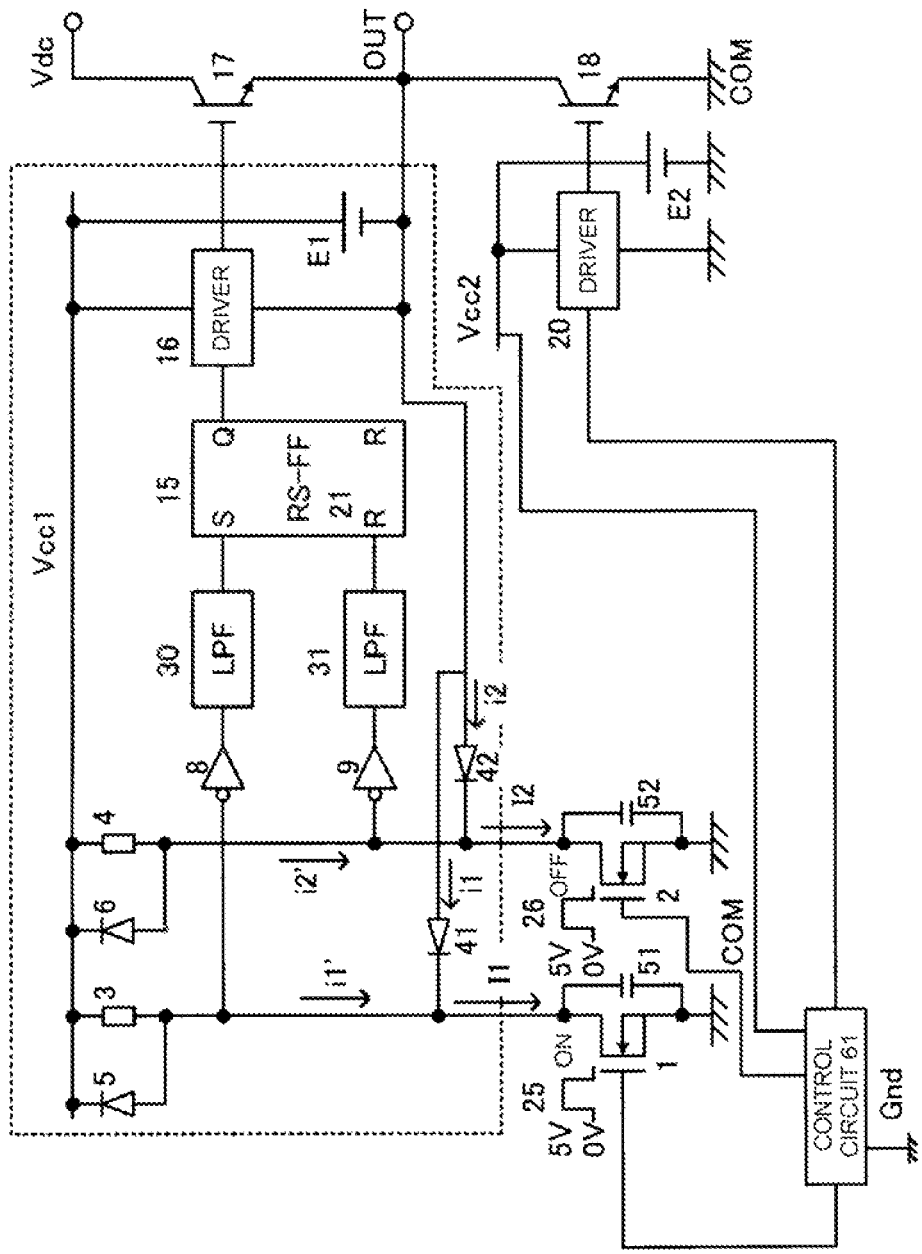
FIG. 7 is a circuit diagram of a high-voltage IC including a typical level shifting circuit.
Figure 8:
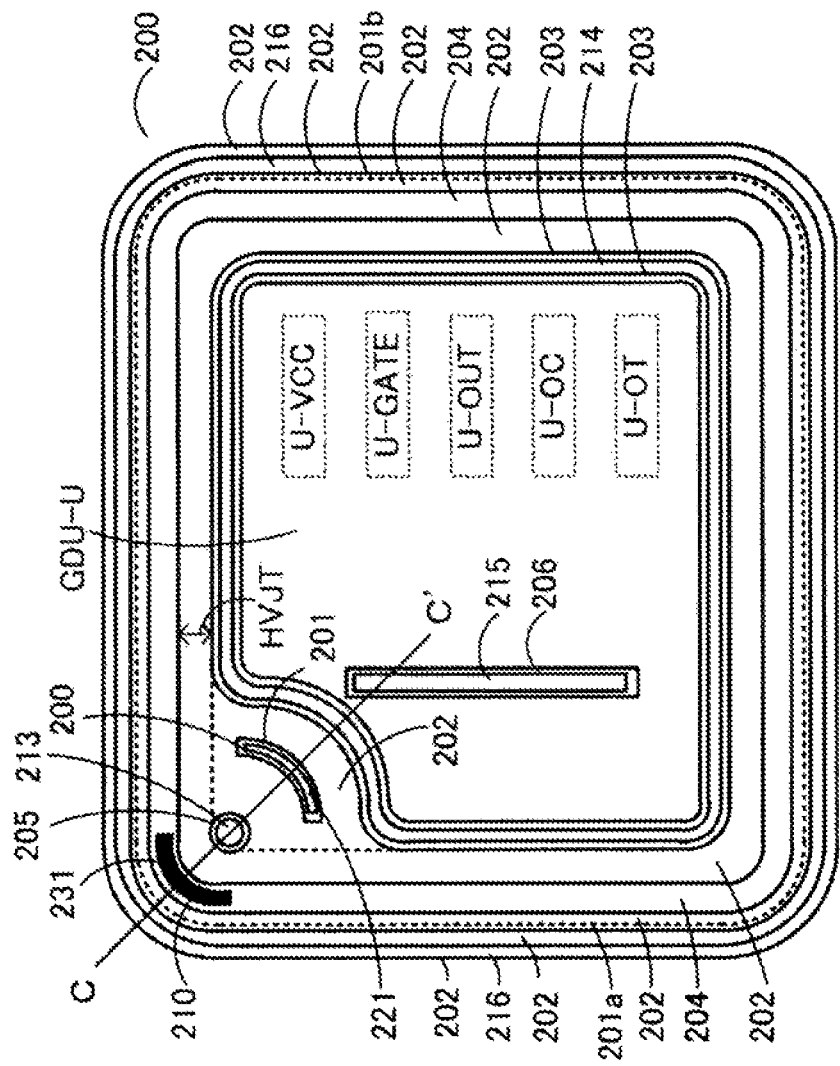
FIG. 8 is a main part plan view of a high-voltage semiconductor device according to the background art.
Figure 9:
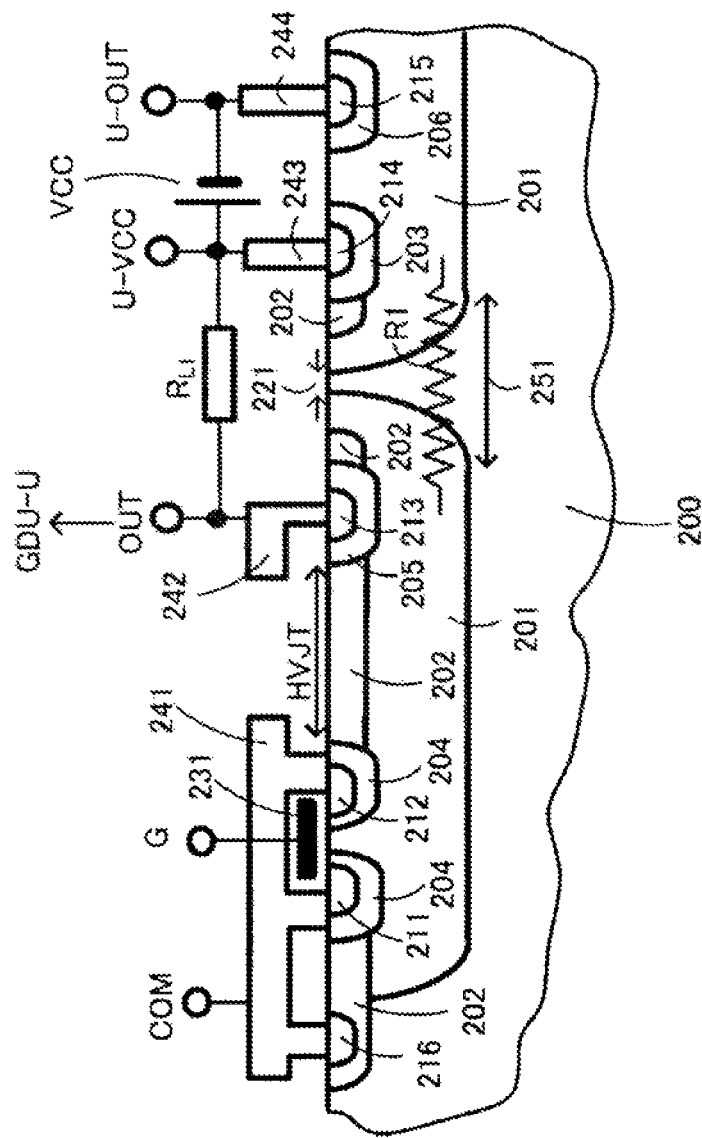
FIG. 9 is a main part sectional view taken on line C-C' in FIG. 8.
Figure 10:
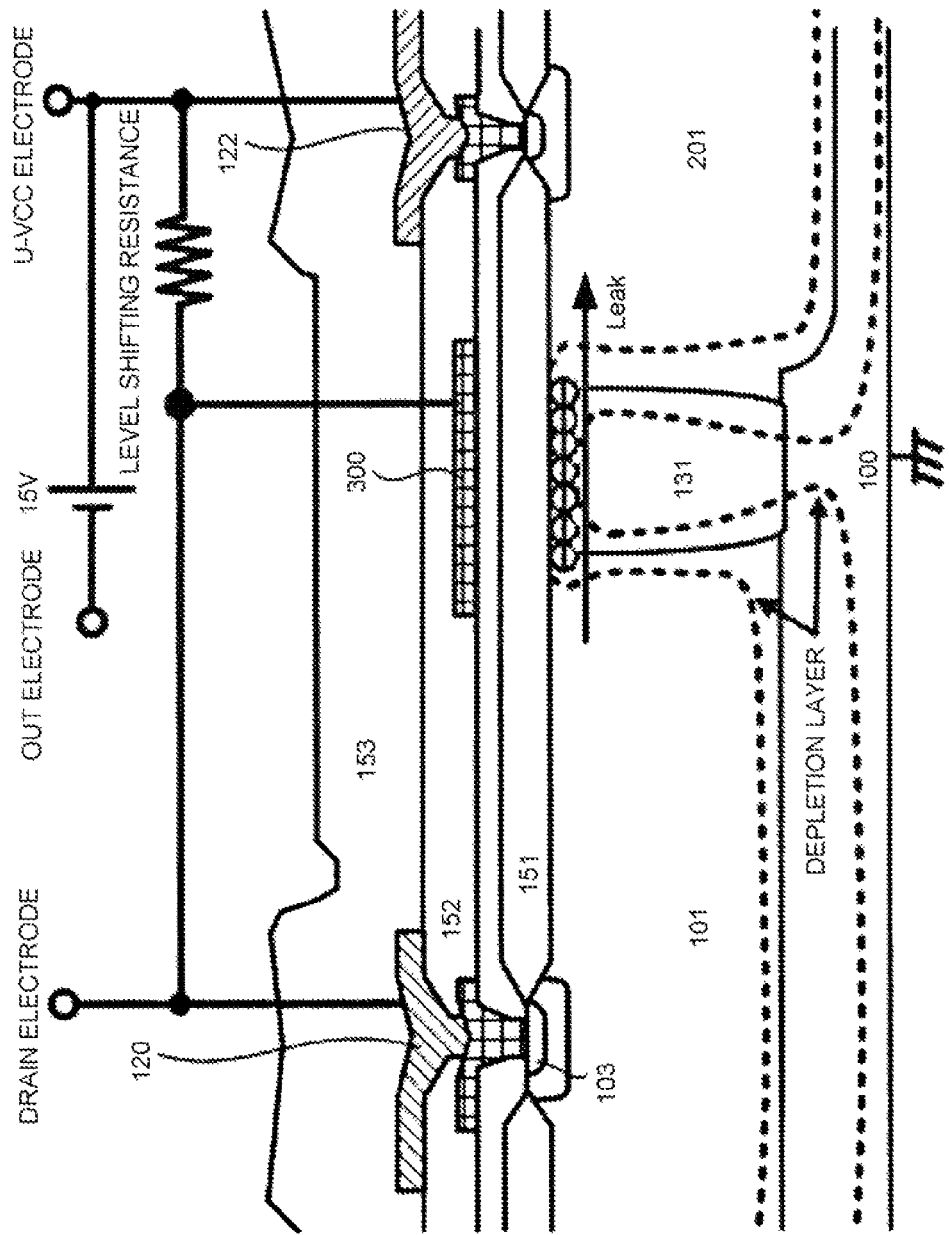
FIG. 10 is a view for explaining the influence of a p⁻ opening portion in FIG. 8 on the voltage withstanding characteristic.

High-voltage MOSFET 71, 72 in FIG. 1 corresponds to the aforementioned high-voltage N-channel MOSFET 1 or the aforementioned high-voltage N-channel MOSFET 2 in FIG. 7. The level shifting circuit portion including the high-voltage MOSFET 71 has the following regions. Phosphorus impurities are selectively ion-injected into a surface layer of a p⁻ silicon substrate 100 with a surface concentration of 1E15/cm³ to 1E16/cm³. Here, E designates an exponent. For example, 1E15 designates 1×10¹⁵. After that, an n⁻ region 101 is formed to be about 7 μm to about 10 μm in Xj by diffusion. A withstand voltage region and an opening region 131 which will be described later are disposed in the n⁻ region 101.

Phosphorus impurities are selectively ion-injected with a surface concentration of $1E16/cm^3$ to $1E18/cm^3$ in an area spaced at a distance of about 150 μm from the peripheral line of the n⁻ region 101 in a planar inner side direction, as a high-side well region for disposing a high-side logic circuit region. An area corresponding to the distance of 150 μm serves as the withstand voltage region. By diffusion after that, an n well region 201 whose depth is about 10 μm to 15 μm in terms of Xj is formed. In the places of the high-voltage MOSFET 1, 2 where a drain n⁺ region 103 and the p⁻ opening region 131 are disposed as will be described later, the n⁻ region 101 is expanded to be wider than the aforementioned 150 μm.

A high-side logic circuit portion 16a (low pass filters 30 and 31, RS-FF15), a high-side driver portion 16, a U-VCC terminal (referred to as UVCC in FIG. 1 for the sake of convenience), a U-GATE terminal for outputting a gate signal, an OUT terminal for connection to the negative electrode side of a power supply for the high-side logic circuit, etc. are disposed in the aforementioned high-side logic circuit region. Of a drain electrode wiring 120 of the high-voltage MOSFET 71, 72, a drain wiring is connected to the high-side logic circuit portion 16a across the p⁻ opening region 131 which will be described later. Here, the drain electrode wiring 120 (conductive path) is the name that both a drain electrode connected directly to the drain n⁺ region 103 and the drain wiring connected to the drain electrode and connected to the high-side logic circuit portion 16a are generically called.

In addition, boron impurities are selectively ion-injected with a surface concentration of $1E15/cm^3$ to $1E19/cm^3$ as a p⁺ ground region 113 (connected to COM potential or Gnd potential) surrounding the n⁻ region 101 and serving as an isolation region from another low-voltage circuit region (forming a low-side circuit formation region). In this Example 1, the p⁺ ground region 113 will be appropriately referred to as first pickup region, which will be described using the same reference sign 113.

By diffusion after that, a p well region 102 which is formed to be about 10 μm to 13 μm in Xj and connected to the p⁻ silicon substrate is formed. In addition, boron impurities are ion-injected into the n⁻ region 101 with a surface concentration of $1E14/cm^3$ to $1E17/cm^3$ so as to locally reach the p⁻ silicon substrate 100. By diffusion after that, a p⁻ opening region 131 is formed to be about 7 μm to 10 μm in Xj so as to reach the p⁻ silicon substrate 100.

In respect to the planar layout, the p⁻ opening region 131 is disposed in the n⁻ region 101 between the n well region 201 (lying in the U-VCC potential), and the drain n⁺ region 103, an n buffer region 104 and a U-VCC potential pickup region 122. The p⁻ opening region 131 is disposed to be long and narrow so as to face the drain n⁺ region 103, the n buffer region 104 and the U-VCC potential pickup region 122 in parallel therewith. Further, the p⁻ opening region 131 is disposed selectively.

The p⁻ opening region 131 is disposed to enter the U-VCC potential pickup region 122 (also referred to as second pickup region) side. When the p⁻ opening region 131 is disposed thus, the parasitic capacitance between the n⁻ region 101 and the p⁻ silicon substrate 100 near the n buffer region 104 of the high-voltage MOSFET 71, 72 can be reduced.

A manufacturing process is shared among the n⁻ region 101, the n well region 201, the p well region 102, and the p⁻ opening region 131. Specifically, the n⁻ region 101, the n well region 201, the p well region 102 and the p⁻ opening region 131 are formed concurrently to have predetermined diffusion depths, for example, at a high temperature not lower than 1,100° C. and in a nitrogen atmosphere.

Next, boron impurities are ion-injected between the p well region 102 and the n⁻ region 101 with a surface concentration of $1E16/cm^3$ to $1E19/cm^3$ so as to serve as a channel region or a base region of the withstand voltage region in each high-voltage MOSFET 71, 72. A source n⁺ region 114 and a contact p⁺ region designated by the same reference sign as the p⁺ ground region 113 are formed in the channel region.

In addition, the first pickup region 113a and the p⁺ ground region 113 are formed in the aforementioned base region. By diffusion after that, a p base region 105 (both the aforementioned channel region and the aforementioned base region of the withstand voltage region) is formed to be about 3.0 μm to 6 μm in Xj. Here, the withstand voltage region designates the n⁻ region 101 between the p⁺ ground region 113 and the drain region 103 or between the p⁺ ground region 113 and the U-VCC pickup n⁺ region 122. The p⁺ ground region 113 serves as a base pickup p⁺ region corresponding to the first pickup region, and either will be described with the same reference sign as the p⁺ ground region 113. In addition, the U-VCC pickup n⁺ region 122 corresponds to a second pickup region, which will be described with the same reference sign.

In addition, phosphorus impurities are ion-injected onto the n⁻ region 101 with a surface concentration of $1E16/cm^3$ to $1E19/cm^3$. By diffusion after that, the n buffer region 104 is formed to be about 1.0 μm to 3 μm in Xj. The n buffer region 104 serves as load resistances 104a and 104b.

Next, the base pickup p⁺ region 113 and the source n⁺ region 114 of each high-voltage MOSFET 71, 72 formed on the surface of the p base region 105, and the drain n⁺ region 103 (also referred to as n⁺ drain region) of the high-voltage MOSFET 71, 72 formed on the n buffer region 104 are ion-injected so that their surface concentrations are $1E20/cm^3$ or higher. After that, annealing treatment is carried out so that Xj is around 0.5 μm by diffusion. The first pickup electrode 113a is disposed on the base pickup p⁺ region 113. The first pickup electrode 113a is connected to the Gnd terminal.

In addition, the U-VCC pickup n⁺ region 122 is formed by ion injection and annealing in the same process as the drain n⁺ region 103. A second pickup electrode 122a is disposed on the U-VCC pickup n⁺ region 122. The second pickup electrode 122a is connected to the U-VCC terminal.

The withstand voltage region corresponds to the n⁻ region 101 put between the base pickup p⁺ region 113 and the U-VCC pickup n⁺ region 122. In the manufacturing process of the withstand voltage region, a gate electrode 115 of each high-voltage MOSFET 71, 72, for example, made of polysilicon is provided to be formed on the p base region 105 through a gate oxide film.

In addition, the drain electrode wiring 120 of each high-voltage MOSFET 71, 72 connected to the drain n⁺ region 103, and a source electrode (source electrode wiring) 121 of the high-voltage MOSFET 71, 72 connected to the source n⁺ region 114 (also referred to as n⁺ source region) are formed out of an aluminum-based material. Then, an LOCOS 151 made of a field oxide film, an interlayer insulating film (silicon oxide film) 152 made of TEOS, BPSG or the like, and a passivation film 153 made of a silicon oxide film and a silicon nitride film by plasma CVD are formed as interlayer insulating films.

In addition, a shield layer 300 connected to the OUT terminal is formed out of an aluminum-based material on the interlayer insulating film 152a disposed on the p⁻ opening region 131 and the load resistances 104a and 104b (n buffer region 104). The OUT terminal is a terminal which is disposed in the high-side logic circuit formation region and which is connected to the negative electrode side of the drive power supply (15V power supply in FIG. 3, which will be described later) of the high-side logic circuit. In addition, the OUT terminal is a terminal which is connected to a terminal which is placed in an intermediate potential between the IGBTs 17 and 18 constituting an inverter circuit.

The interlayer insulating film 152 is formed again on the shield layer 300. The source electrode 121, the drain electrode wiring 120, the first pickup electrode 113a and the second pickup electrode 122a are formed, and the passivation film 153 is applied thereon. In this manner, the shield layer 300 and each of the electrodes and the electrode wirings are formed as two-layer wirings. Connection conductors a connect the electrodes 121, 120, 113a and 122a with the regions 113, 103 and 122 respectively. The connection conductors a and the shield layer 300 are formed concurrently. In addition, the first pickup electrode 113a is connected to the source electrode 121.

In addition, the source electrode 121 is connected to the Gnd terminal, the drain electrode wiring 120 is connected to the drain terminal, the first pickup electrode 113a is connected to the Gnd terminal, the second pickup electrode 122a is connected to the U-VCC terminal, and the shield layer 300 is connected to the OUT terminal. The potential applied to the OUT terminal fluctuates between the principal circuit power supply voltage Vdc of a power device (such as IGBT) shown in FIG. 7 and the Gnd. The power device is driven by this high-voltage semiconductor device (power IC) from the ground potential.

In the structure of FIG. 1, a load resistance (also referred to as level shifting resistance) for a level shifting circuit provided between the drain terminal and the U-VCC terminal in each high-voltage MOSFET 71, 72 is obtained by the n buffer region 104 provided within the n$^-$ region 101 serving as the withstand voltage region. The n buffer region 104 serves as the load resistances 104a and 104b for the level shifting circuit. A drain current of the high-voltage MOSFET 71, 72 is applied to the n buffer region 104 serving as the load resistances 104a and 104b, in accordance with a set input signal or a reset input signal. Due to a voltage drop generated by the drain current, a signal is transmitted to a gate of a subsequent-stage CMOS logic (a not-shown gate of the high-side logic circuit portion 16a in FIG. 1) so as to carry out the operation of the level shifting circuit.

In FIG. 1, the distance between the set-side and reset-side high-voltage MOSFETs 71 and 72 is depicted to be shorter for the sake of convenience (due to the illustrated reduction scale or the like). In the real layout, the drain n$^+$ regions 103 of the set-side and reset-side high-voltage MOSFETs 71 and 72 are laid to be separate from each other at a distance of at least several hundreds of micrometers so as to prevent the drains of the high-voltage MOSFETs 71 and 72 from being connected to each other through a low resistance. Thus, wrong signals of input signals between the both are prevented from being transmitted.

Figure 3:
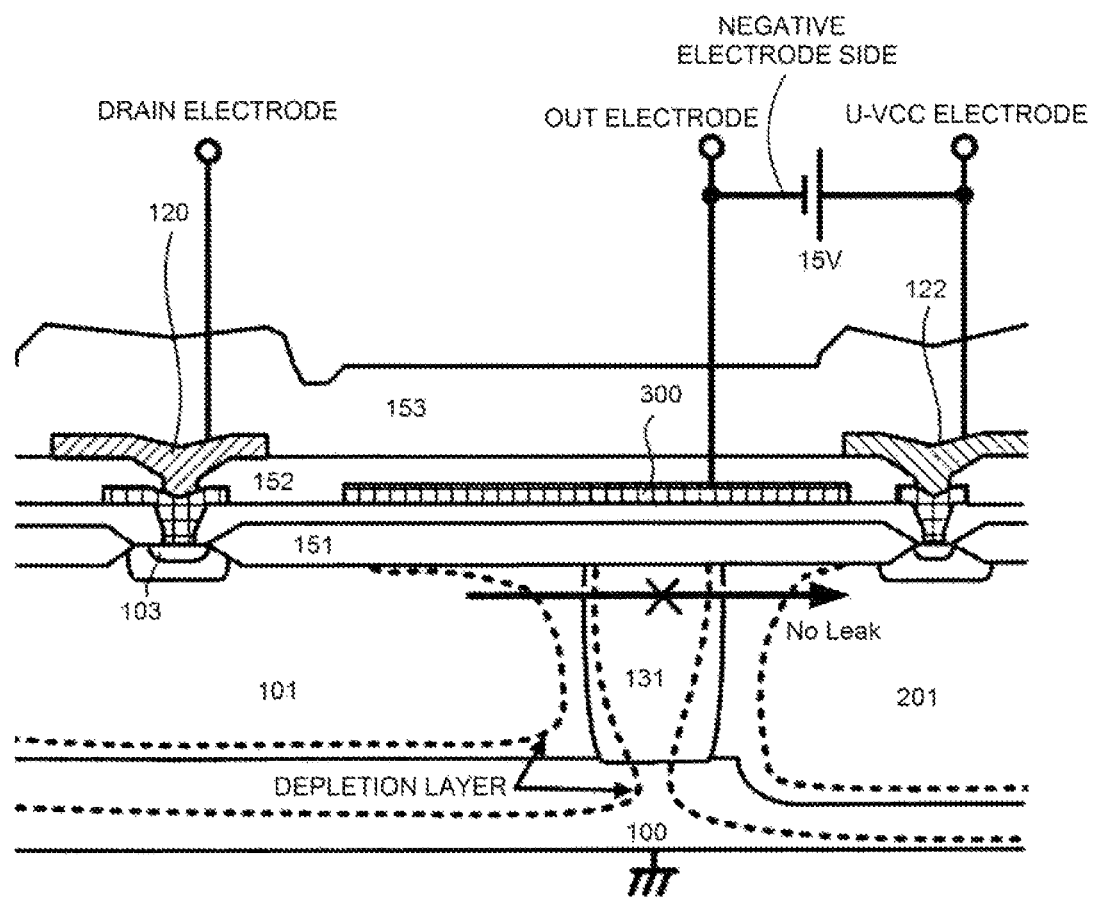
FIG. 3 is a view for explaining the influence of a p⁻ opening portion in FIG. 1 on the voltage withstanding characteristic.

The influence of this structure on the voltage withstanding characteristic will be described with reference to FIG. 3. FIG. 3 is a view for explaining the influence of the p$^-$ opening in FIG. 1 on the voltage withstanding characteristic. When a high voltage (e.g. 1,200 V) is applied to the drain electrode wiring, all of the n$^-$ region 101 serving as the withstand voltage region put between the metal field plate (an overhanging portion of the source electrode wiring 121 onto the n$^-$ region 101) on the source side of each high-voltage MOSFET 71, 72 and the metal field plate (an overhanging portion of the drain electrode wiring 120 onto the n$^-$ region) on the drain side of the high-voltage MOSFET 71, 72 and the p$^-$ opening region 131 are entirely depleted to give no influence to the voltage withstanding characteristic. Particularly, as for the p$^-$ opening region 131, a depletion layer extends from the junction surface between the p$^-$ opening region 131 and the n$^-$ region 101 disposed on the opposite side surfaces of the p$^-$ opening region 131 so that the potential gradient can be made uniform at higher potential than the semiconductor substrate 100.

When high voltage (e.g. 1,200 V) is applied to the drain terminal and the U-VCC terminal, it is necessary to prevent a high-concentration n$^+$ region from being formed around the p$^-$ opening region 131, so as to prevent breakdown in the p$^-$ opening region 131. For example, the p$^-$ opening region 131 and the n buffer region (diffusion layer) 104 are placed at a distance of several tens of micrometers or longer so as to prevent a high electric field near the p$^-$ opening region 131. In addition, when the opening width of the p$^-$ opening region 131 is too wide, the p$^-$ opening lower portion cannot be entirely depleted but there is a possibility that the withstanding voltage may be limited in the lower portion of the p$^-$ opening region 131. It is therefore desired that the width of the p$^-$ opening region 131 is about 10 µm to 20 µm.

Here, according to the invention, the shield layers 300 connected to the OUT potential as shown in FIG. 7 are disposed onto the p$^-$ opening regions 131 through insulating films in order to suppress the occurrence of N type inversion or surface punch-through in the surface of the p$^-$ opening region 131 on the drain region side of the high-voltage MOSFET 71 in the switching state of the high-voltage MOSFETs 71 and 72, particularly in the state where the high-voltage MOSFET 71 is OFF and the high-voltage MOSFET 72 is ON.

Figure 11:
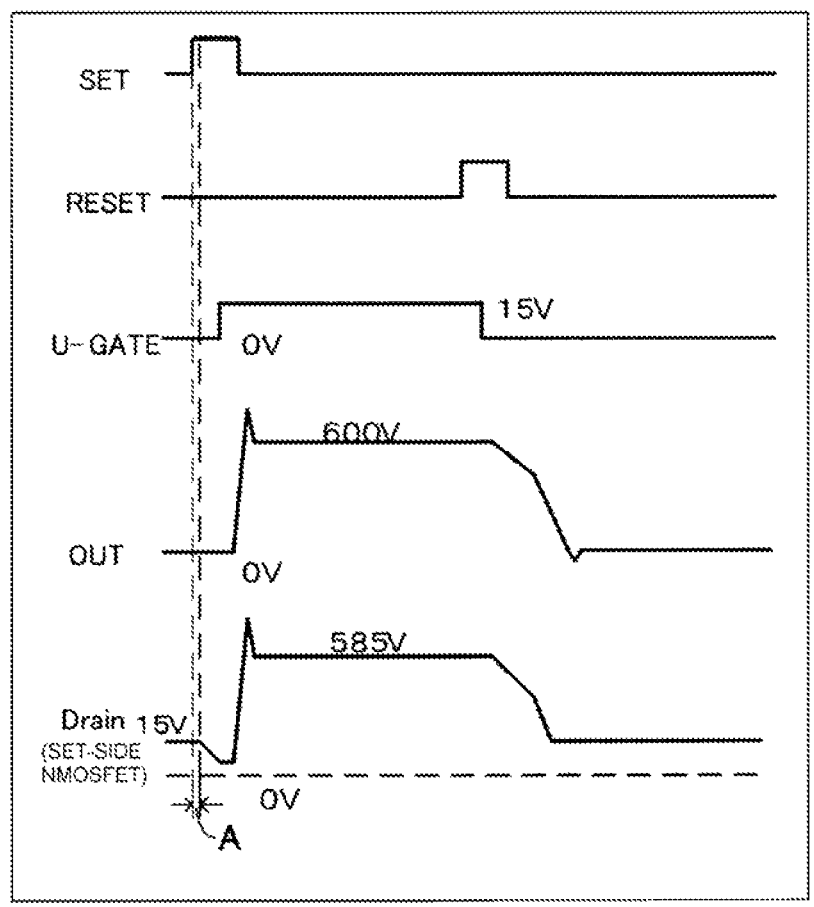
FIG. 11 is a chart showing a signal waveform in each portion of a high-voltage semiconductor device.

As shown in FIG. 3, the shield layer 300 is connected to the OUT terminal, and the potential thereof is fixed to the OUT potential. Therefore, the potential of the shield layer 300 on the p$^-$ opening region 131 is still equal to the ground potential even when the potential of the n region adjacent to the p$^-$ opening region 131 rises to Vcc1 (about 15 V here) immediately after the high-voltage MOSFET 71 is changed to be turned ON in the state where the high-voltage MOSFET 71 is OFF and the high-voltage MOSFET 72 is ON (in a period A in FIG. 11). Thus, there is no fear that the surface of the p$^-$ opening region 131 will be inverted.

Although the example in which the shield layer 300 is formed out of an aluminum-based material has been described in Example 1, the invention is not limited to this, but polysilicon or another conductivity type material may be used. In addition, according to the invention, the shield layer 300 is applied from above the p$^-$ opening region 131 in order to relax the electric field near the p$^-$ opening region 131. The U-VCC potential pickup regions 122 lying in the U-VCC potential (Vcc1 potential in FIG. 7) and the drain n$^+$ regions of the high-voltage MOSFETs 71 and 72 are coated with the shield layers 300, which are further overlapped and overhung on the load resistances 104a and 104b.

In this manner, avalanche breakdown near the p$^-$ opening regions 131 can be prevented when the potential in the drains of the high-voltage MOSFETs 71 and 72 or the potential Vcc1 increases to high voltage. As a result, there is no fear that a region with a locally high electric field intensity may appear near the p$^-$ opening region 131, so that it is possible to obtain stable voltage withstanding characteristic and stable level shifting operation.

Description has been made in the case where the level shifting circuit is configured so that the high-voltage MOSFETs 71 and 72 and the p$^-$ opening region 131 disposed between the drain n$^+$ region 103 and the high-side logic circuit region are provided, and a part of the withstand voltage region (n⁻ region 101) is used as a level shifting resistance. Further, also in a "divided RESURF" structure (structure described in PTL 1) in which a p⁻ slit region surrounds a drain so as to entirely isolate the drain up to a ground potential region, there is an effect that N type inversion in the surface of the p⁻ slit region can be suppressed when a shield layer 300 fixed to an OUT potential (or connected to an OUT terminal) is disposed under a drain electrode wiring 120 with interposition of an insulating film 152. Although the shield layer 300 is disposed under the second pickup electrode 122a in FIG. 2, this is caused by the sectional view taken on line A-A'. As understood from the plan view of FIG. 1, the shield layer 300 is also disposed under the drain electrode wiring 120 shown by the broken line.

In addition, the shield layer 300 is depicted only on the p⁻ opening region 131 on the drain region side of the set-signal-side high-voltage MOSFET 71 in FIG. 1 for the sake of convenience for illustration. Practically, however, the shield layer 300 is also disposed on the p⁻ opening region 131 on the drain region side of the reset-signal-side high-voltage MOSFET 72.

In addition, although the shield layer 300 is also applied onto the n buffer region 104, the shield layer 300 may be not applied to the n buffer region 104. In the case where the n buffer region 104 is coated with the shield layer 300, the load resistances 104a and 104b can be better prevented from suffering potential fluctuation due to a not-shown wiring disposed above the load resistances 104a and 104b, in comparison with the case where the n buffer region 104 is not coated with the shield layer 300. Thus, the reliability is improved.

Although description has been made above in the case where the n⁻ region 101 is formed by diffusion of impurities, the invention is not limited to this. For example, the n⁻ region 101 may be formed by epitaxial growth on the p⁻ silicon substrate 100 in place of the method in which the n⁻ region 101 is formed by diffusion of impurities. In this case, the concentration of impurities in the n⁻ region 101 may be set within a range of from $1E14/cm^3$ to $1E16/cm^3$.

Also in the following examples, a similar effect can be likewise obtained when the n⁻ region 101 consisting of a diffusion region is replaced by a region formed by epitaxial growth or an n⁻ SOI layer formed on an SOI substrate. In addition, when the shield layer 300 is also disposed under the drain electrode wiring 120 as shown in FIG. 1, the potential in the surface of the n⁻ region 101 under the drain electrode wiring is stabilized by the shield layer 300 so that the withstanding voltage and the reliability can be improved.

Example 2

Figure 4:
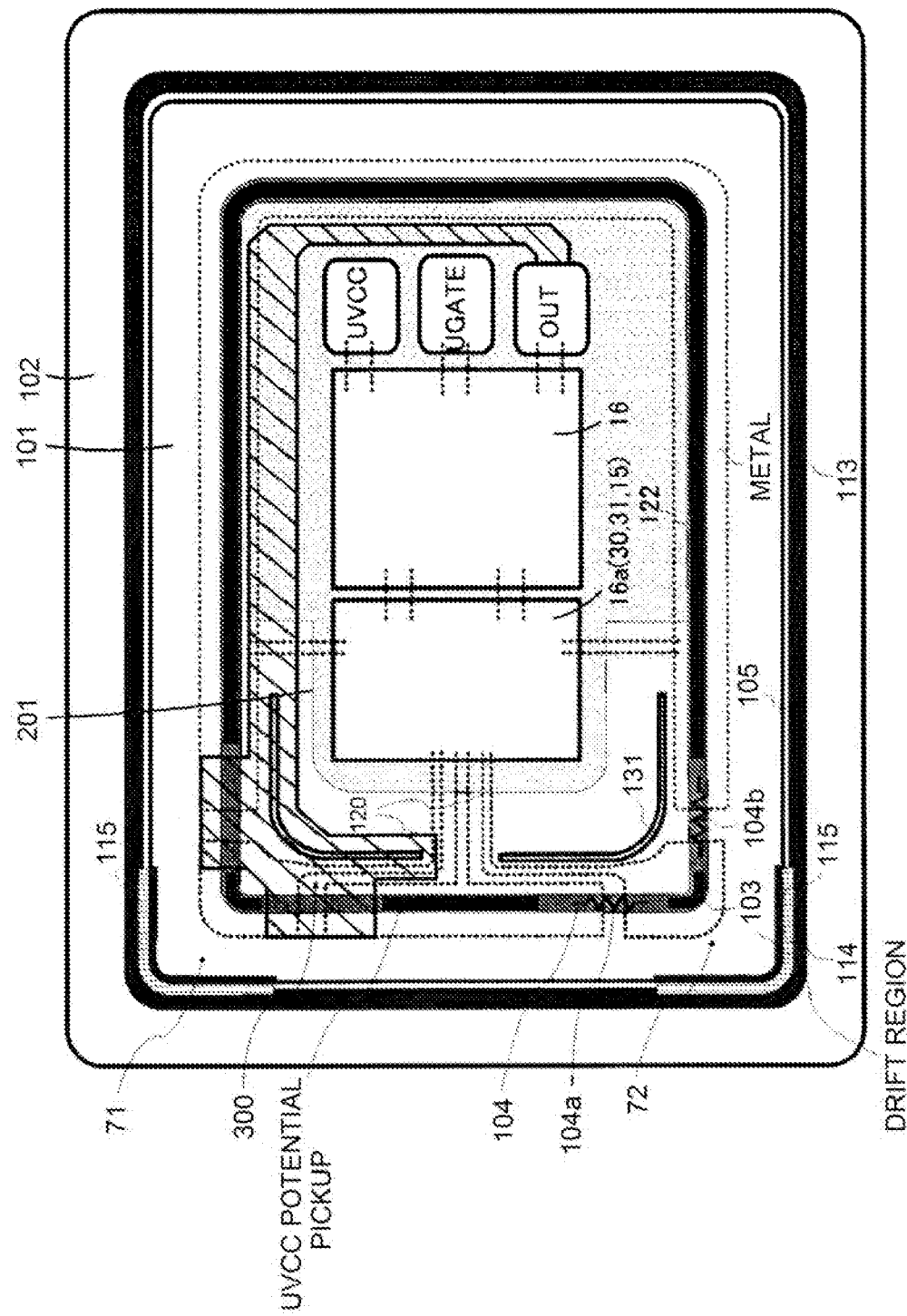
FIG. 4 is a main part plan view of a high-voltage semiconductor device according to Example 2 of the invention.

FIG. 4 is a main part plan view of a high-voltage semiconductor device according to Example 2 of the invention. FIG. 4 shows a main part plan view of a high-voltage IC in which a level shifting circuit portion including high-voltage N-channel MOSFETs and a drive circuit including a floating potential region are formed on one and the same semiconductor substrate.

The high-voltage semiconductor device according to Example 2 is different from the high-voltage semiconductor device according to Example 1 shown in FIG. 1 in that the drain electrode wirings 120 in ohmic contact with the drain n⁺ regions of the high-voltage MOSFETs 71 and 72 do not intersect (cross over) the upper portions of the p⁻ opening regions 131.

In FIG. 4, the potential of the drain electrode wiring 120 always fluctuates in accordance with the switching state of each high-voltage MOSFET 71, 72. Thus, when the p⁻ opening region 131 lies just under the drain electrode wiring 120, the surface concentration of the p⁻ opening region 131 is reduced so that there is a possibility that N type inversion may occur in spite of the shield layer 300 disposed thereon. Therefore, according to the invention, the drain electrode wiring 120 is prevented from intersecting (crossing over) the upper portion of the p⁻ opening region 131 but is made to pass, through an insulating film, on a region located between the U-VCC potential pickup region 122 formed in the withstand voltage region (n⁻ region 101) and the p⁻ opening region 131.

Thus, it is possible to obtain a level shifting circuit in which N type inversion does not occur in the surface of the p⁻ opening region 131 but the level shifting resistance can be stabilized so that there is no failure in transmission in any switching state. In addition, when the drain electrode wiring 120 does not cross over the upper portion of the p⁻ opening region 131 but is taken out to the upper portion of the withstand voltage region through the LOCOS 151, the reliability in voltage withstanding characteristic can be improved.

Example 3

Figure 5:
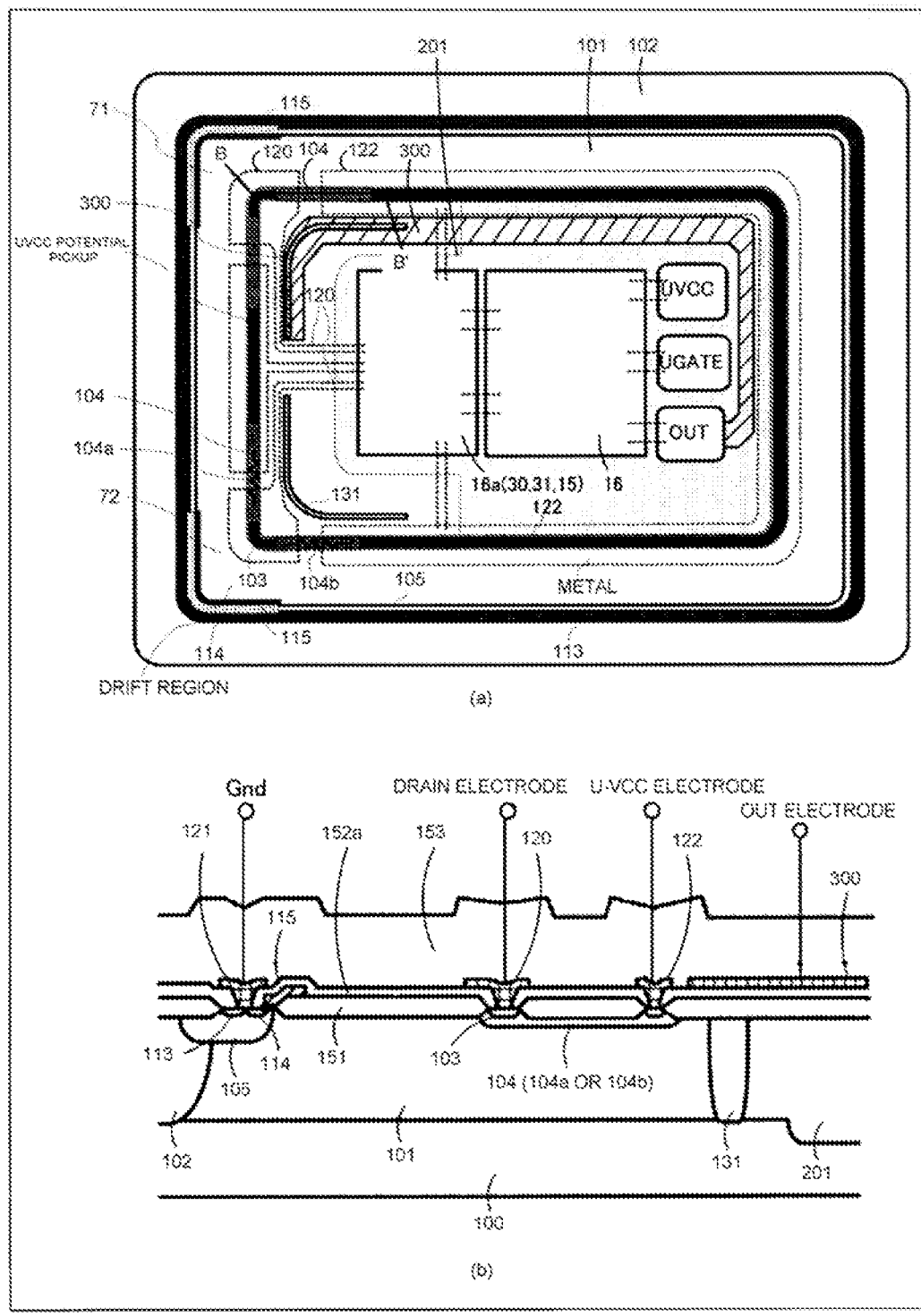
FIG. 5 is an explanatory view of a high-voltage semiconductor device according to Example 3 of the invention.

FIG. 5 is an explanatory view of a high-voltage semiconductor device according to Example 3 of the invention. FIG. 5(a) shows a main part plan view of the high-voltage semiconductor device according to Example 3 of the invention. FIG. 5(b) shows a main part sectional view taken on line B-B' in FIG. 5(a).

The high-voltage semiconductor device according to Example 3 is different from the high-voltage semiconductor device according to Example 1 shown in FIG. 1 in that the drain electrode wiring 120 is not disposed on the shield layer 300 and the shield layer 300 is not disposed on the load resistances 104a and 104b. In the high-voltage semiconductor device according to Example 3, the drain electrode wiring 120 is disposed thus so that the shield layer 300 and the drain electrode wiring 120 can be disposed as a single layer on the interlayer insulating film 152a. It is therefore possible to reduce the manufacturing cost according to the high-voltage semiconductor device according to Example 3. In addition, increase in a leakage current from the p⁻ opening region 131 can be suppressed in the same manner as in the case of FIG. 1.

Example 4

Figure 6:
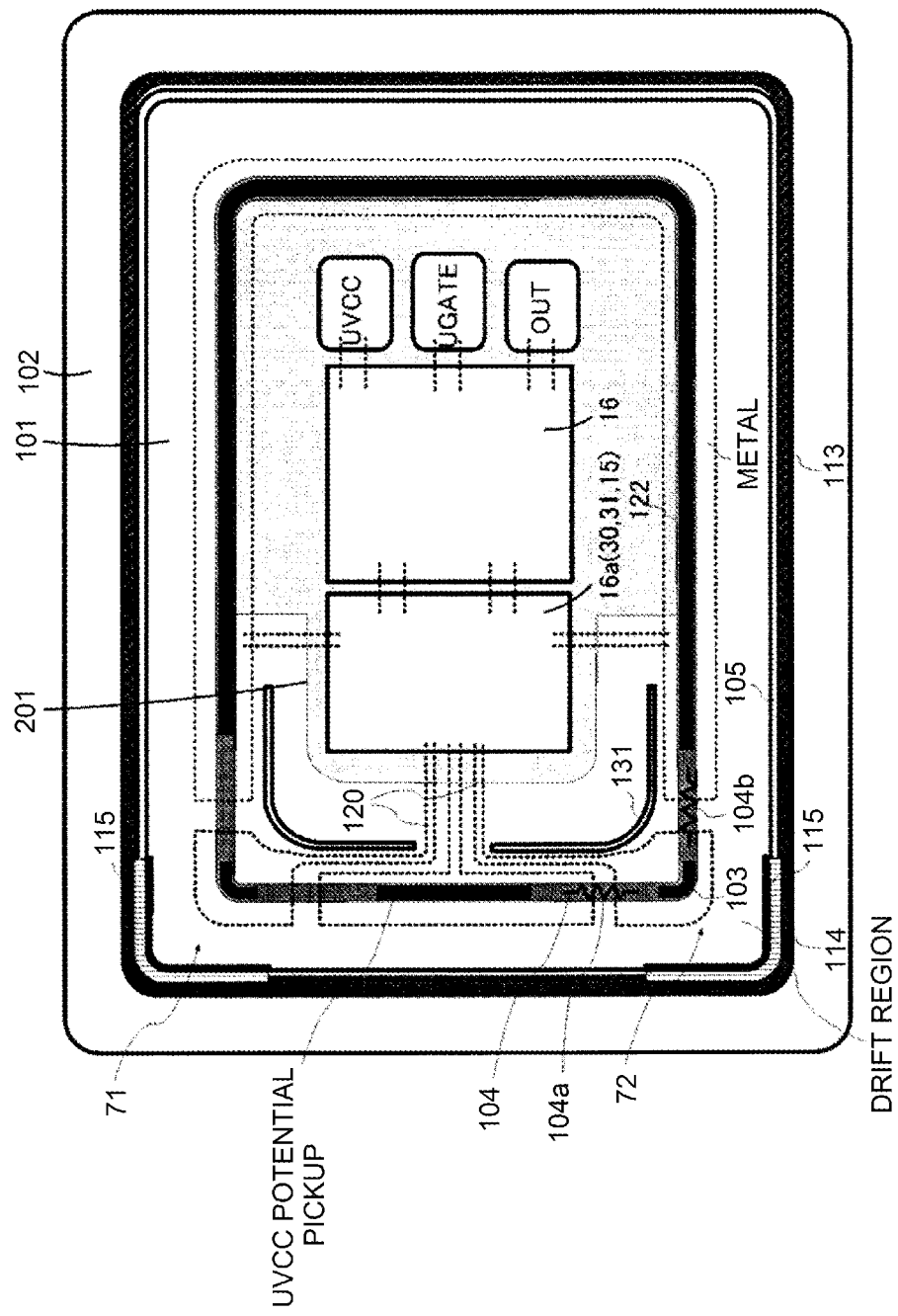
FIG. 6 is a main part plan view of a high-voltage semiconductor device according to Example 4 of the invention.

FIG. 6 is a main part plan view of a high-voltage semiconductor device according to Example 4 of the invention. The high-voltage semiconductor device according to Example 4 is different from the high-voltage semiconductor device according to Example 2 shown in FIG. 4 in that the shield layer 300 is not disposed. In the high-voltage semiconductor device according to Example 4, the drain electrode wiring 120 does not cross over the p⁻ opening region 131, so that the reliability in voltage withstanding characteristic can be improved. In addition, in the high-voltage semiconductor device according to Example 4, the shield layer 300 is not disposed so that the manufacturing cost can be reduced as compared with that in the high-voltage semiconductor device according to Example 2 shown in FIG. 4.

Although description has been made using a silicon substrate as a semiconductor substrate in the Examples 1 to 4, an effect can be similarly obtained using a semiconductor substrate made of a material other than silicon such as SiC or GaN. In addition, although the case where a level shifting resistance is formed within a semiconductor substrate has been described in the aforementioned examples, the invention is not limited to this. For example, a polysilicon resistance may be formed as a level shifting resistance on a semiconductor substrate through an insulating film in a high-side logic circuit region.

INDUSTRIAL APPLICABILITY

As described above, a high-voltage semiconductor device according to the invention is suitable particularly as a high-voltage semiconductor device including a level shifting circuit capable of transmitting an on/off signal from a circuit placed at ground potential to a gate of a power device, which constitutes an upper arm of a power-inverting bridge circuit such as a PWM inverter or a switching power supply, without potential isolation.

REFERENCE SIGNS LIST 16 high-side driver portion
16a high-side logic circuit portion
71,72 high-voltage MOSFET
100 p⁻ silicon substrate
101 n⁻ region
102 p well region
103 drain n⁺ region
104 n buffer region
104a,104b load resistance
105 p base region (channel region)
113 p⁺ ground region (first pickup region)
114 source n⁺ region
115 gate electrode (set/reset signal side gate)
120 drain electrode wiring
121 source electrode wiring
122 U-VCC potential pickup region (second pickup region)
122a second pickup electrode
131 p⁻ opening region
201 n well region
300 shield layer

The invention claimed is:

1. A high-voltage semiconductor device comprising:
a second conductivity type well region which is formed on a first conductivity type semiconductor substrate and includes a logic circuit formation region and a withstand voltage region surrounding the logic circuit formation region;
a first conductivity type well region which is formed on the semiconductor substrate so as to surround the withstand voltage region;
a transistor which includes a second conductivity type drain region selectively formed in a surface layer of the second conductivity type well region between the withstand voltage region and the logic circuit formation region and having a higher concentration of impurities than the withstand voltage region, and a second conductivity type source region selectively formed in the surface layer of the second conductivity type well region, and which uses the withstand voltage region between the drain region and the source region as a drift region and uses the first conductivity type well region as a base region;
an opening region which is provided locally in the second conductivity type well region between the drain region and the logic circuit formation region so as to prevent the second conductivity type well region from lying all over the opening region in a depth direction; and
a conductive path which electrically connects the drain region with a logic circuit in the logic circuit formation region; the high-voltage semiconductor device further comprising:
a shield layer which is formed on a first insulating layer formed on a surface of the opening region and which is connected to a negative electrode side of a power supply connected to the logic circuit in the logic circuit formation region.

2. The high-voltage semiconductor device according to claim 1, wherein:
the conductive path is formed on the shield layer through a second insulating layer so as to cross over the opening region.

3. The high-voltage semiconductor device according to claim 1, wherein:
the conductive path and the shield layer are conductive layers which are formed on a same insulating layer.

4. The high-voltage semiconductor device according to claim 1, further comprising:
a second conductivity type pickup region which is provided in the surface layer of the second conductivity type well region between the withstand voltage region and the opening region so as to be connected to a high potential side of the power supply in the logic circuit formation region formed separately from the drain region; wherein:
the shield layer is formed on a surface between the drain region and the second conductivity type pickup region through the first insulating layer.

5. The high-voltage semiconductor device according to claim 4, further comprising:
a second conductivity type buffer region which is formed between the drain region and the second conductivity type pickup region so as to abut against the second conductivity type buffer region and the second conductivity type pickup region, and which has a higher concentration of impurities than the second conductivity type well region and a lower concentration of impurities than the drain region and the second conductivity type pickup region.

6. The high-voltage semiconductor device according to claim 1, wherein:
opposite ends of the opening region reach the first conductivity type well region so that the second conductivity type well region in which the drain region is formed is separated from the logic circuit formation region.

7. The high-voltage semiconductor device according to claim 2, further comprising:
a second conductivity type pickup region which is provided in the surface layer of the second conductivity type well region between the withstand voltage region and the opening region so as to be connected to a high potential side of the power supply in the logic circuit formation region formed separately from the drain region; wherein:
the shield layer is formed on a surface between the drain region and the second conductivity type pickup region through the first insulating layer.

8. The high-voltage semiconductor device according to claim 3, further comprising:
a second conductivity type pickup region which is provided in the surface layer of the second conductivity type well region between the withstand voltage region and the opening region so as to be connected to a high potential side of the power supply in the logic circuit formation region formed separately from the drain region; wherein:

the shield layer is formed on a surface between the drain region and the second conductivity type pickup region through the first insulating layer.

\* \* \* \* \*